(12) United States Patent
Daniel et al.

(10) Patent No.: US 8,074,350 B2
(45) Date of Patent: Dec. 13, 2011

(54) METHOD OF PRINTING ELECTRONIC CIRCUITS

(75) Inventors: Jurgen H. Daniel, San Francisco, CA (US); Ana C. Arias, San Carlos, CA (US); Steven E. Ready, Los Altos, CA (US)

(73) Assignee: Palo Also Research Center Incorporated, Palo Alto, CA (US)

( * ) Notice: Subject to any disclaimer, the term of this patent is extended or adjusted under 35 U.S.C. 154(b) by 885 days.

(21) Appl. No.: 11/953,959

(22) Filed: Dec. 11, 2007

(65) Prior Publication Data

US 2009/0145641 A1 Jun. 11, 2009

(51) Int. Cl.
*H05K 3/30* (2006.01)
(52) U.S. Cl. ............. 29/832; 29/831; 29/846; 29/847; 29/852
(58) Field of Classification Search .............. 29/852, 29/830, 831, 832, 846, 847; 438/112, 106, 438/108, 119, 127; 174/258; 361/726, 737; 427/97, 98
See application file for complete search history.

(56) References Cited

U.S. PATENT DOCUMENTS

| | | | | |
|---|---|---|---|---|
| 5,510,139 A * | 4/1996 | Deissner et al. | | 427/97.2 |
| 6,071,371 A * | 6/2000 | Leonard et al. | | 156/297 |
| 6,555,414 B1 * | 4/2003 | Vanfleteren et al. | | 438/108 |
| 6,706,234 B2 * | 3/2004 | Huang | | 264/435 |
| 2004/0151978 A1 * | 8/2004 | Huang | | 429/83 |

* cited by examiner

*Primary Examiner* — Derris Banks
*Assistant Examiner* — Tai Nguyen
(74) *Attorney, Agent, or Firm* — Marger Johnson & McCollom, P.C.

(57) ABSTRACT

A method of printing electronic circuits uses pattern recognition to detect locations of interconnects on electronic components oriented on a substrate such that the interconnects face away from the substrate, the interconnects having ramps between the interconnects and the substrate, adjusts routing paths as needed based upon a difference between an intended placement and an actual placement of the electronic components, and generates a new image file for printing with adjusted routing paths. A device has at least one electronic component having interconnects, a ramp from a surface of the substrate to the interconnects, wherein the ramp is formed of one of either a polymer or an adhesive, a printed, conductive path on the ramp providing electrical connection to at least one of the interconnects.

14 Claims, 5 Drawing Sheets

METHOD OF PRINTING ELECTRONIC CIRCUITS

BACKGROUND

The ability to print electronic circuits has several advantages. It is generally faster and less expensive to print the features than to perform the repeated steps of depositing, masking and etching layers to form the connections on a conventional printed circuit board (PCB). Image files can be used to direct the printing of the circuits, rather than reticles used in forming the masks. Printers may also be less expensive than photolithography steppers and other equipment needed to form the circuits by more conventional methods.

Currently, printed circuits are combined with discrete components, such as integrated circuit chips, memory chips, batteries, connectors, logic chips, etc., by mounting the discrete electronics on a conventionally manufactured printed circuit board and then connecting the printed electronic circuit substrate, such as flexible tape, etc. For purposes of this discussion here, all of the discrete electronics will be referred to as 'chips.' This process may involve heating, ultrasonic agitation and underfill. The bonding process may also involve the use of anisotropic conductive tape and a pressure bond.

Generally, in current electronic circuit architectures, the interconnects for the discrete electronic components, such as integrated circuit chips, reside on the printed circuit board (PCB), and the chips are 'flip-chip' mounted, such that the interconnects face downward towards the board. To combine the discrete electronics with printed electronic circuits, the chips are mounted with their interconnects facing upwards, and then the lines are printed to connect the chips together for operation. Interconnects may include solder balls, such as ball grid arrays used to connect chips to conventional printed circuit boards.

DETAILED DESCRIPTION OF THE EMBODIMENTS

Figure 1:
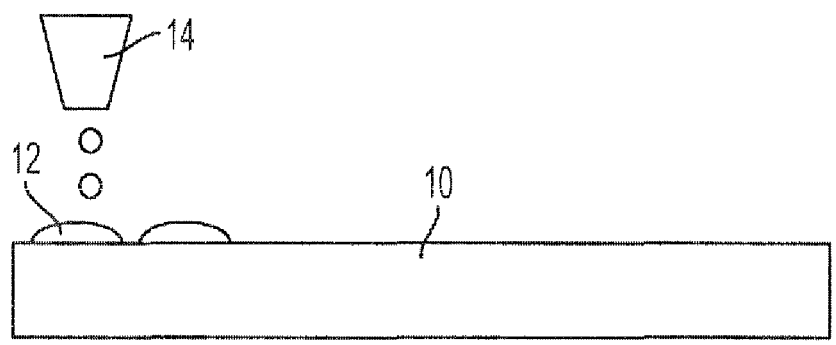
FIGS. 1-5 show an embodiment of a process to print electronic circuits.

FIG. 1 shows a substrate 10 having printed upon it printed circuit features 12. The substrate may consist of many materials such as rigid or flexible or bendable materials, including glass, silicon, steel, ceramic, polyimide, Mylar™, polyethylenenaphthalene (PEN), polynorbonene, polyethylene, FR-4 and others. The printed features may be formed by dispensing of conductive material from a print head 14 such as an ink jet print head. The printhead may rely, for example, on piezoelectric, thermal, or electrostatic actuation mechanisms. The features may also be printed by other methods such as dip-pen dispensing methods or aerosol jet-printing methods.

Implementations of the methods of this invention do not necessarily require that features be printed on the substrate. Implementations of this invention may be used to provide connections between the interconnects of integrated circuits electronic components with or without other printed features.

Figure 2:
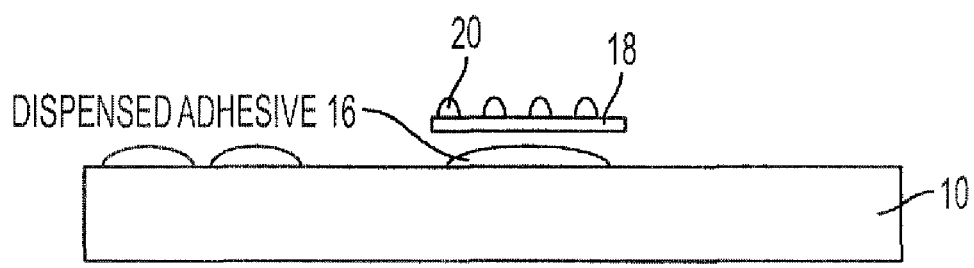

FIG. 2 shows a process for attaching an integrated circuit 18 to the substrate using an adhesive 16. It should be noted that instead of the dispensed adhesive 16, an adhesive substance may be coated on the integrated circuit. Moreover, the integrated circuit may be attached without any dispensed adhesive to the substrate by thermal bonding if the substrate or the substrate surface consists of a thermoplastic polymer or substance.

As mentioned previously, semiconductor integrated circuit dies, also referred to as 'chips,' are typically mounted 'upside down' or 'flip chip' on a substrate, with the interconnects facing the substrate. Interconnects may include such structures as solder balls, stud bumps, pins, package leads, bond pads, etc. The figures used in this discussion show solder balls, but other interconnects may be used. Moreover, although the words 'solder ball' is used, the contact spheres or contact protrusions do not literally have to consist of solder such as tin/lead solder. They may also consist of other materials, such as gold, silver, copper, indium, metal alloys, etc. and the material may be deposited by a plating method such as electroplating or electroless plating or other deposition methods. They also may consist of an organic conducting material such as PEDOT:PSS or an organic/inorganic composite, such as carbon nanotubes in a polymer matrix.

In implementations of the methods disclosed here the device will have the interconnects facing away from the substrate, to allow connections to them to be printed. The components may be placed with a pick and place method. Although the discussion refers to the 'chips' as integrated circuits, electronic components or devices with many functionalities are included, such as MEMS-type sensor and actuator chips, light emitting diode (LED) chips, photo-sensor chips, batteries, capacitors, oscillators, antennas, electrical connectors, etc. The components may attach to the substrate with adhesive underneath or by thermal bonding, etc.

Figure 3:
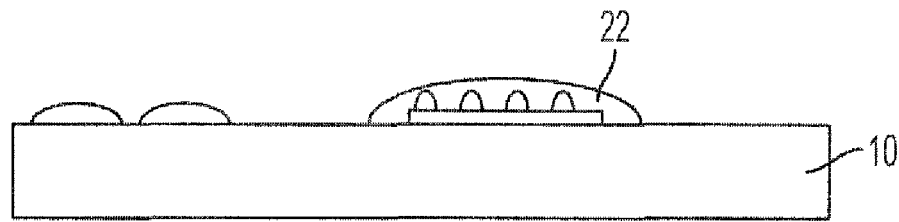

As can be seen in FIG. 2, the step up between the substrate and the top of the solder balls is somewhat large and abrupt, due to the thickness of the chip. This makes printing connections to the solder balls more difficult, if not impractical. FIG. 3 shows a polymer 22 dispensed over the top of the chip that can be used to form a ramp. A ramp, as that term is used here is a gradual transition, from the substrate to the top of the solder balls. The dispensing may occur, for example, by jet-printing, spray nozzle dispensing or commonly used syringe dispensers such as the ones from Intellispense™, Integrated Dispensing Solutions, of Agoura Hills, Calif.

One issue that arises in this process, however, is that the solder balls have to be exposed to allow electrical connection. The polymer must be an insulator, or the solder balls would short to each other. Without exposing the tops of the solder balls, no connection will be possible to the integrated circuits.

Figure 4:
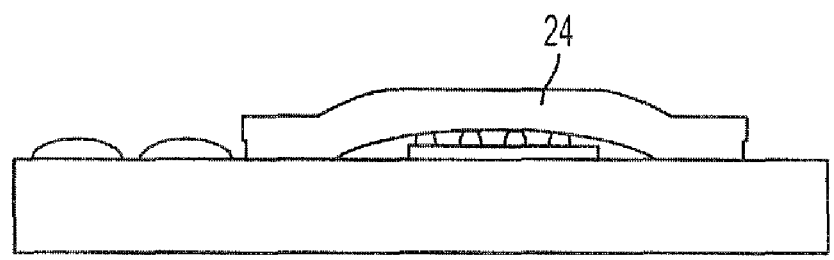
Figure 5:
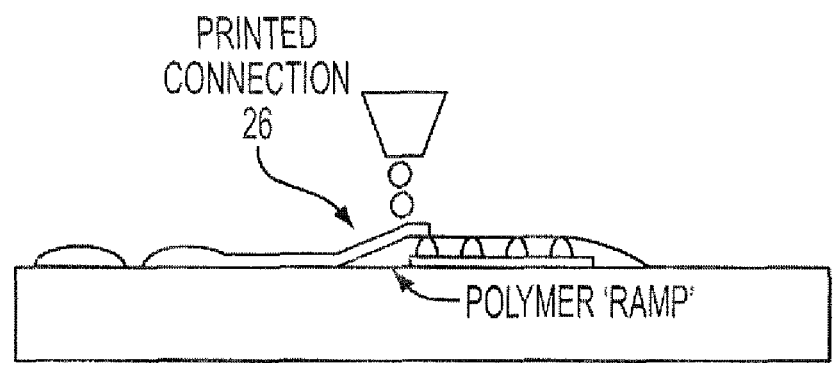
Figure 6:
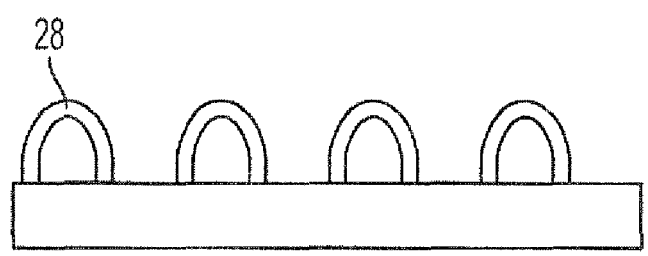
FIGS. 6-8 show an alternative embodiment of a process to print electronic circuits.

FIG. 4 shows one embodiment of a method to expose the tops of the solder balls. A mold 24, such as a rubber or silicone sheet or other elastomeric material, is pressed down on the polymer 22 from FIG. 3. An example of such mold materials are the silicone rubbers from Dow Corning under the trade name Silastic or specifically the silicone Sylgard®184. This will cause the polymer to displace from the top of the solder balls, as well as shaping a more gradual ramp. In one embodiment, the mold is heated to allow the polymer to flow away from the solder balls more easily. The polymer may then be solidified by cooling such as in thermoplastic polymers, by exposure to UV light or other radiation or by thermal cross-linking, etc. The mold is then removed. The molded polymer may consist of a range of insulating materials, such as epoxies, acrylics, phenols, polyurethanes, polystyrenes, etc. and it may also consist of composites such as polymers with dispersed organic or inorganic micro-or nanoparticles. Specific examples of UV curable polymers are the polymers DC7165 or 60-7010 from Epoxies, Etc. of Cranston, R.I. In a nanoparticle composite polymer, the particles may consist of silica, titania, zirconium oxide, barium titanate, aluminum oxide or other insulating materials As can be seen in FIG. 5, the molded polymer forms a gradual ramp for printing of electrically conductive lines. As an example, the conductive lines may consist of printed silver, deposited from silver nanoparticle solutions (such as the ones form Cabot, Corp. or from Nanomas Technologies Inc.), or they may consist of conducting polymers such as the polythiophene PEDOT:PSS or polyaniline or they may be deposited from carbon nanotube solutions. In order to perform accurate jet-printing, the method may need to adjust the distance between the printhead and the surface during the printing process to compensate for the added height.

An optional cleaning process to condition the surface prior to printing may also be used to ensure the solder balls are substantially clean and polymer free. In some cases a surface cleaning process such as plasma, ozone or carbon dioxide cleaning may be used to clean off the surface. A laser ablation process may also be employed to remove some of the polymer.

In addition, the polymer may provide a surface that is compatible with jet printing. Various ranges of surface energies work better with particular types of material used in jet printing conductive lines. For example, for printing narrow and continuous lines of an ethylene glycol based silver-nanoparticle ink, a surface with a water contact angle between 40 and 90 degrees was chosen. The polymer may have a particular surface energy compatible with jet printing or it may have a surface modifiable for jet printing. Thus conditioning of the surface may occur by cleaning or by a surface modification process or by a combination of both. For example, the polymer surface may be modified by an oxygen plasma or by attaching a self assembled monolayer such as a silane or silazane layer. In one example the surface modification may consist of a coating of HMDS (Hexamethyldisilazane).

The use of a mold, however, is an optional process. It is possible that the interconnects could either be treated with, or manufactured from, a material that repels the polymer. For example, if the polymer were dispensed as a liquid, the interconnects could have a low surface energy, repelling the liquid from the tops of the solder balls.

The solder balls could be manufactured from a hydrophobic material, or could be coated with a hydrophobic or low surface energy coating after manufacture. An example of such coatings is thiols that attach to a gold surface. If the bond pads or bond bumps are based on gold, the thiols selectively adhere to their surface. Fluorothiols or thiols with long alkyl functional groups result in low surface-energy coatings. Hexadecanethiolate self assembled monolayers are one example of hydrophobic coatings. A roughened surface of the solder balls could further decrease the surface energy and render the solder contacts more repellent.

Figure 7:
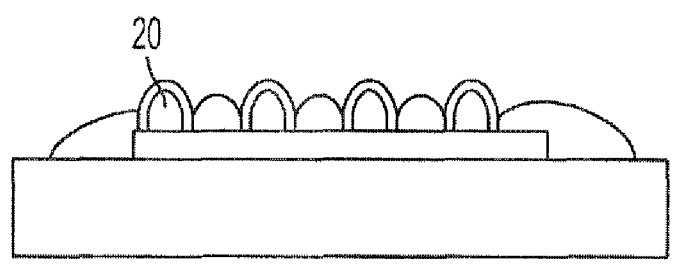
Figure 8:
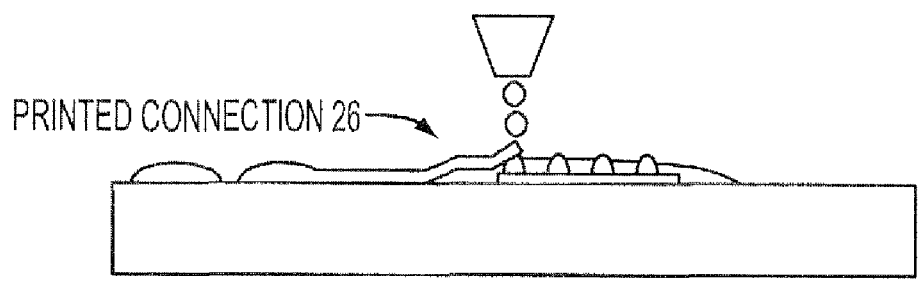

When the polymer solution is dispensed, as in FIG. 7, the solder balls 20 repel the polymer solution and it settles between the solder balls and to the sides of the chips. The extent of this effect of course depends on the surface tension of the polymer solution. A water-based polymer such as PVA (polyvinylalcohol), for example, would be strongly repelled by the hydrophobic coating. Since in this method, molding may not be absolutely necessary, the interconnects could consist also of simple flat contact pads instead of raised solder balls. FIG. 8 shows the printing of the connection lines 26 on the ramp formed from the polymer off to the side of the chips. This method may also be combined with the molding process described earlier in order to achieve a better more gradual profile of the ramp. In either case, the repelling of the material, either with or without the molding, shapes the ramp to form the gradual transition necessary.

The 'shaping' of the ramp, either by molding, or by repelling of the material used to form the ramp, differentiates this approach from previous approaches. For example, in U.S. Pat. No. 7,243,421, a ramp is formed by dispensing of an adhesive in a 'track' between the end of a connective line and the top of the electrical components. The adhesive is printed into the track and no further action occurs. In the embodiments described here, the material is dispensed and is acted upon either by a mold, or repelling forces, to form the ramp.

Figure 9:
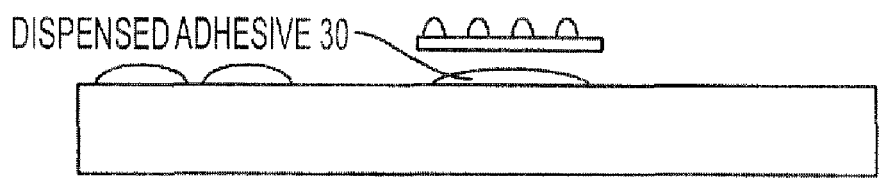
FIGS. 9-11 show an alternative embodiment of a process to print electronic circuits.
Figure 10:
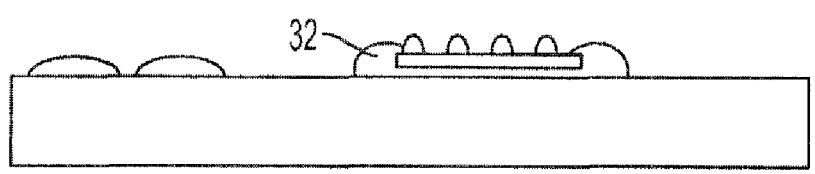

In another embodiment, an excessive amount of adhesive could be dispensed. As shown in FIG. 9, the dispensed adhesive 30 could be over-dispensed as the ramp material, instead of dispensing an extra material. When the chip is placed on the adhesive, as shown in FIG. 10, the excess adhesive may at least partially form ramps such as 32 to the sides of the integrated circuits.

Figure 11:
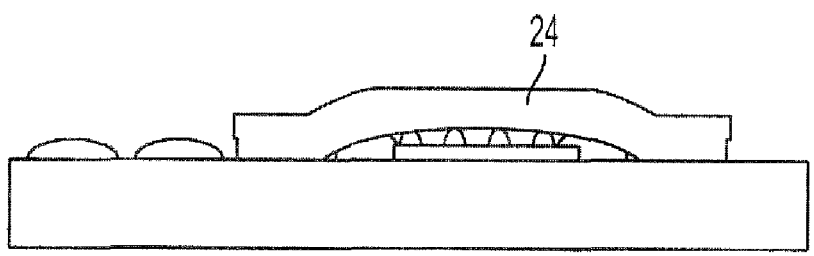

In FIG. 11, the mold 24 may be pressed down onto the chip and the excess adhesive to form the gradual ramp. The printing would then commence as shown in FIGS. 5 and 8. In one embodiment, the excess adhesive would not require the mold process and the connecting lines could be printed directed on the excess adhesive. However, this may not be successful, as the ramps may be too abrupt and not have a smooth enough surface or gradual profile for optimal printing of conductive lines.

In this manner, the printing of connections between discrete electronic components, or between electronic components and pre-printed features may be accomplished on a flexible substrate.

Figure 12:
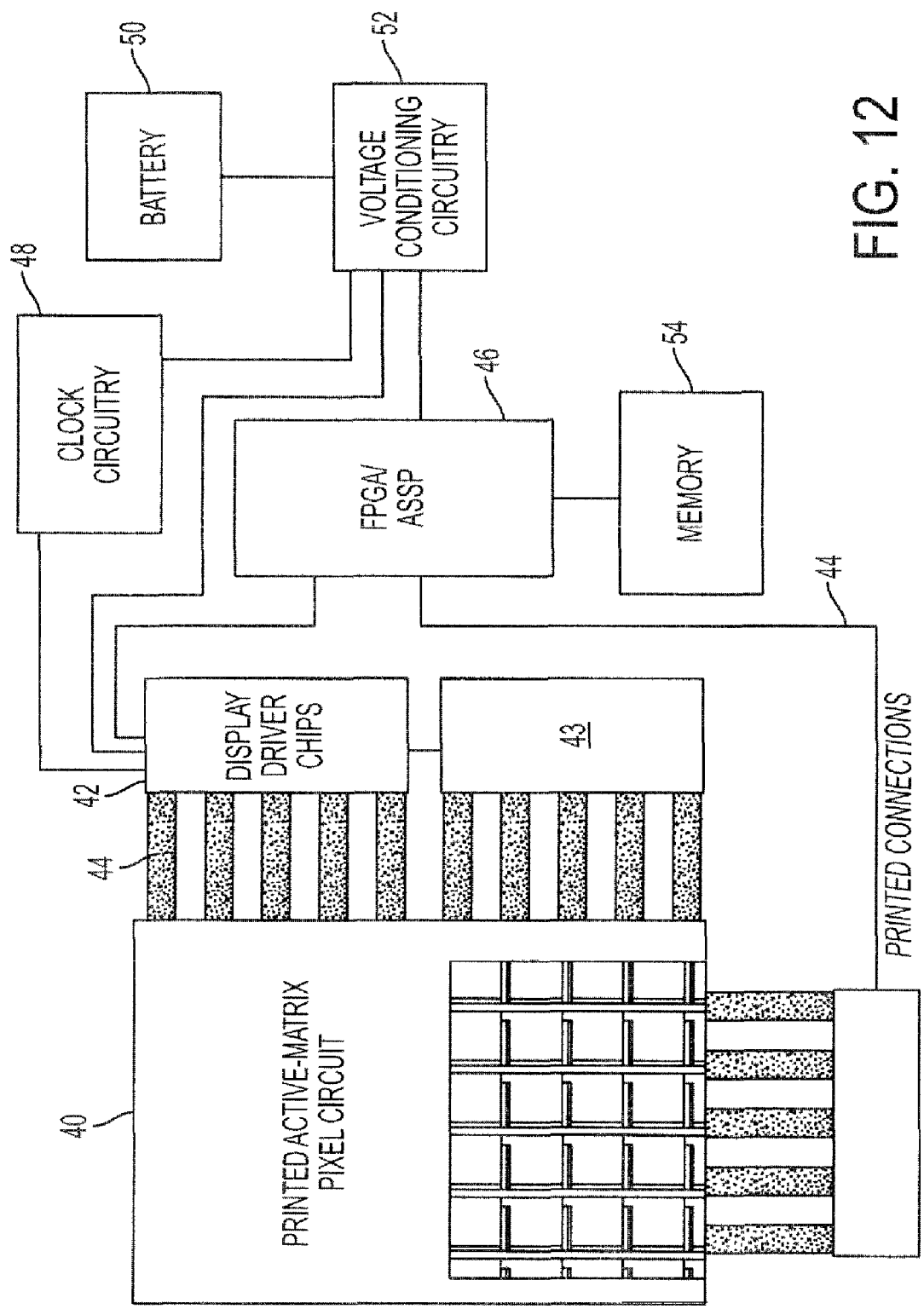
FIG. 12 shows an embodiment of a circuit having printed connection lines.

An issue that also arises in such printing processes is that of alignment. When several chips are combined together on a substrate, with multiple connecting lines between the various chips, the chips all have to be aligned correctly to a predetermined image pattern that is generally provided to the printer that performs the printing of the lines. An example of such a circuit is shown in FIG. 12.

A pixel circuit for an active-matrix display 40 has multiple printed connections. Some of these connections are to the display driver chips 42 and 43, as well as memory 54, field programmable gate array 46, a clock circuit 48 a battery 50 and a voltage conditioning circuit 52. This circuit has a high density of printed lines that require all of the various components to be in their predetermined positions in the image file provided to the printer.

Figure 13:
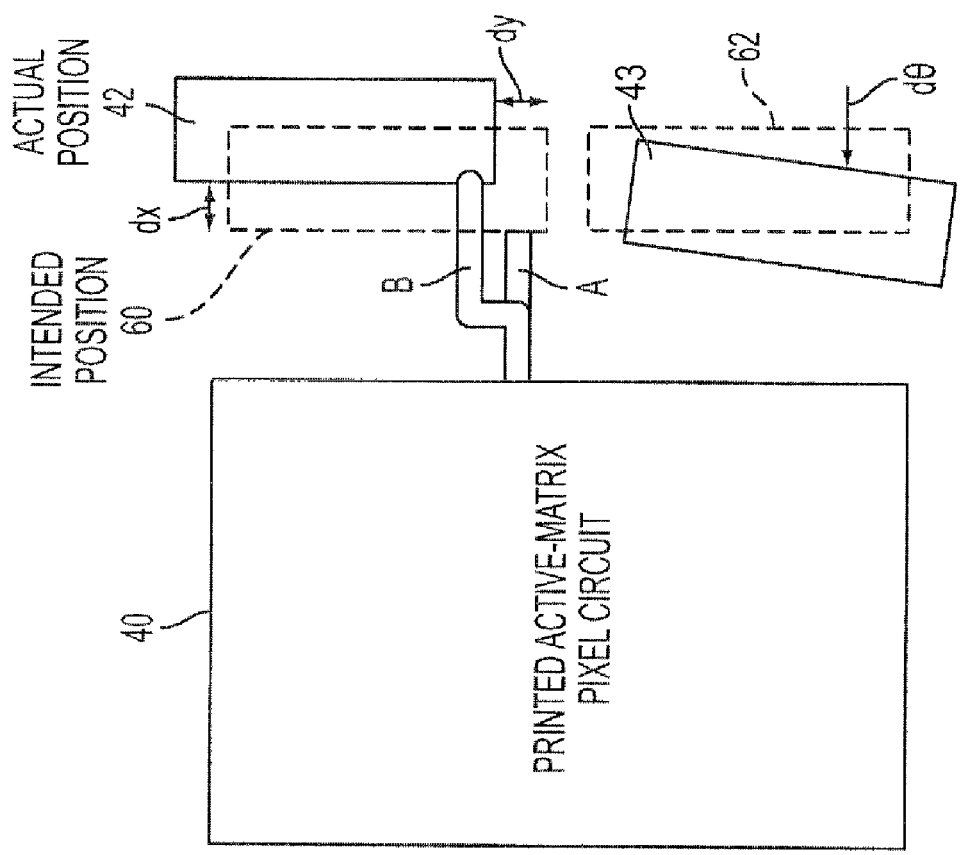
FIG. 13 shows an example of a circuit for which an alignment correction would be required.

An example of a misaligned component in such a circuit is shown in FIG. 13. For simplicity, only the pixel circuit 40 and the driver chips 42 and 43 are shown. As can be seen in this figure, the actual position of the driver chip 42 is different from the intended position 60. The chip is displaced in both the x and y directions.

In another type of alignment problem, driver chip 43 is skewed from its intended position. The resulting displacement in the x and y directions would not suffice for correction, as there is also a displacement angle $\theta$. Prior to printing of the connecting lines, these displacements must be corrected.

Currently, if any correction is made, it is performed by visual inspection and adjustment. Obviously, this prevents high speed manufacturing of printed circuits. The adjustment process must be somewhat automated to allow high-speed and 'on the fly' correction of the image file used for printing the connecting lines.

Figure 14:
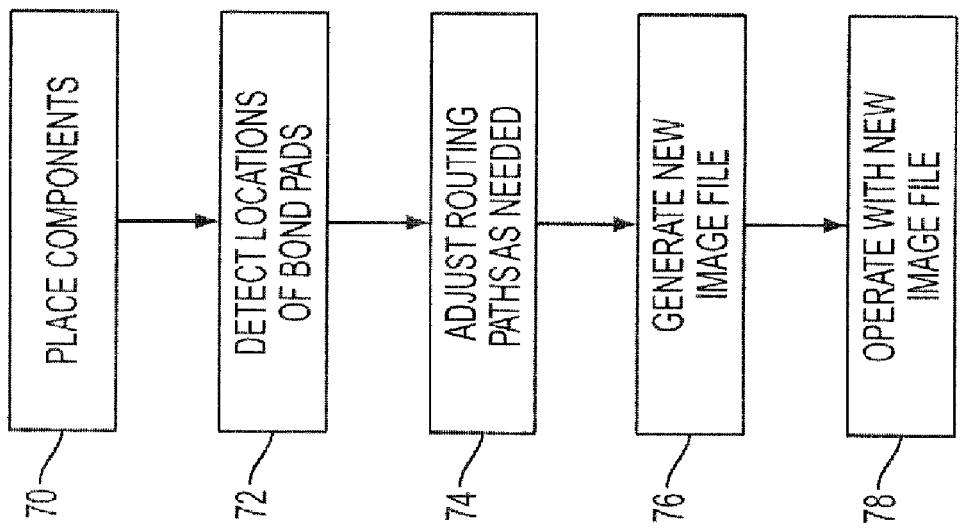
FIG. 14 shows an embodiment of a method to print electronic circuits with alignment correction.

FIG. 14 shows an embodiment of a method to correct for misalignments, also referred to as displacements, after placement of the chips but before printing of the connecting lines. The process begins with the placement of the components at 70.

Once placed, the components have their interconnections pointing upwards, which constitute relatively large metal structures formed in a recognizable pattern. Using pattern recognition and an automated visual detection system, the method then detects the locations of the bond pads, or interconnects, at 72.

Using the actual locations of the bond pads or interconnects, the method can adjust the routing paths to the interconnects. In one embodiment, an auto-routing program such as Allegro PCB Router from Cadence Systems is used to adjust the routing paths for the new locations of the interconnects. US Patent Application No. 20050114821 provides a more detailed description of auto-routing. A new image file is then generated at 76 for use in the manufacture of the connections.

At 78, the new image file is used in whichever operation is being performed. In one embodiment, discussed above, the new image file is used to print the connecting lines. In an alternative embodiment, the new image file may be used to form vias using laser ablation or other etching processes or to perform a laser deposition process, electron beam deposition process or ion beam deposition process. In the embodiment where the image file is used to print the connecting lines, multiple layers of printed lines may be achieved by including data on printing an insulating material between layers to avoid shorting crossing lines. The insulating material may be, for example, a radiation curable polymer or another polymer such as polyvinylphenol or PMMA. Although we have primarily described printed conductive connections between the components, other types of printed connections may also apply. For example, if the components communicate via optical paths, the printed connections may consist of light guides. In this case an optical polymer or layers of optical polymers may be printed or dispensed as light guides between the components.

In this manner, the printed connecting lines may be printed correctly to effect electrical connections between chips on a substrate, or between chips and printed features. As mentioned above, this process may occur in an on-the-fly fashion immediately after the placing of the components on the substrate, including in a roll-to-roll printing process. The components may or may not have been treated using a molding or other process as discussed above to create a gradual ramp from the substrate to the interconnects as discussed above as well.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A method of printing electronic circuits, comprising:
   placing at least one electronic component having interconnects on a substrate such that the interconnects are on a surface of the component opposite a surface of the component in contact with the substrate;
   forming a ramp from the substrate to the interconnects by one of either:
      dispensing a material onto the substrate such that the material contacts the electronic component by one of either dispensing a polymer onto the substrate and the component and shaping a ramp from the substrate to the interconnects out of the material by either pressing a mold down over the interconnects to displace the polymer from the surface of the interconnects to expose at least part of the interconnects, or
      dispensing an adhesive prior to placing the electronic component such that excess adhesive resides on the substrate adjacent to the component and pressing a mold down over the component and excessive adhesive;
   or pressing a mold down over the component and excessive adhesive; and
   printing at least one conductive line across the ramp such that the line provides electrical connection to at least one interconnect on the component.

2. The method of claim 1, further comprising printing features on the substrate prior to placing the electronic component.

3. The method of claim 1, further comprising conditioning the surface of the substrate, the ramp and the interconnects prior to the printing.

4. The method of printing electronic circuits of claim 1, further comprising:
   using pattern recognition to detect locations of the interconnects;
   adjusting routing paths as needed based upon a difference between an intended placement and an actual placement of the electronic components; and
   generating a new image file for printing with adjusted routing paths.

5. The method of claim 4, the method being performed dynamically during placement of the paths and printing of the adjusted routing paths.

6. The method of claim 4, wherein adjusting routing paths further comprises using routing software.

7. The method of claim 4, further comprising placing the electronic components on the substrate.

8. The method of claim 7, wherein placing the electronic components further comprises placing the electronic components such that there is sufficient space adjacent each component for adjusted routing paths.

9. The method of claim 4, further comprising printing the adjusted routing paths to provide electrical connections to the interconnects.

10. The method of claim 9, wherein printing further comprises depositing insulating materials on a first layer of the adjusted routing paths to allow a second layer of adjusted routing paths to be printed.

11. The method of claim 4, further comprising using the new image file to form vias.

12. A method of printing electronic circuits, comprising:
   placing at least one electronic component having bond interconnects on a substrate such that the interconnects are on a surface of the component opposite a surface of the component in contact with the substrate;
   dispensing a material onto the substrate such that the material contacts the electronic component;
   forming a ramp from the substrate to the interconnects out of the material;
   detecting locations of the interconnects using pattern recognition;

adjusting routing paths as needed based upon a difference between an intended placement and an actual placement of the electronic component; and generating a new image file with the adjusted routing path;

printing at least one conductive line using the new image file such that the line provides electrical connection to at least one interconnect on the component.

13. A method of printing electronic circuits, comprising:

placing at least one electronic component having interconnects on a substrate such that the interconnects are on a surface of the component opposite a surface of the component in contact with the substrate;

dispensing a material onto the substrate such that the material contacts the electronic component wherein the material is at least partially repelled from the interconnects;

shaping a ramp from the substrate to the interconnects out of the material repelled from the interconnects; and printing at least one conductive line across the ramp such that the line provides electrical connection to at least one interconnect on the component.

14. The method of claim 13, further comprising conditioning the surface of the interconnects prior to dispensing the material such that the interconnects at least partially repel the material.

* * * * *

UNITED STATES PATENT AND TRADEMARK OFFICE
CERTIFICATE OF CORRECTION

PATENT NO. : 8,074,350 B2  
APPLICATION NO. : 11/953959  
DATED : December 13, 2011  
INVENTOR(S) : Jurgen H. Daniel et al.

Page 1 of 1

It is certified that error appears in the above-identified patent and that said Letters Patent is hereby corrected as shown below:

On the Title page item (73) Assignee, the words "Palo Also Research Center Incorporated" should read -- Palo Alto Research Center Incorporated --.

Signed and Sealed this  
Twenty-second Day of October, 2013

Teresa Stanek Rea  
*Deputy Director of the United States Patent and Trademark Office*